United States Patent [19]
Bell

[11] 4,115,149
[45] Sep. 19, 1978

[54] CONCENTRATOR ARRANGEMENT FOR PHOTOVOLTAIC CELL

[75] Inventor: Ronald L. Bell, Woodside, Calif.

[73] Assignee: Varian Associates, Inc., Palo Alto, Calif.

[21] Appl. No.: 807,937

[22] Filed: Jun. 20, 1977

Related U.S. Application Data

[63] Continuation-in-part of Ser. No. 666,273, Mar. 12, 1976, abandoned.

[51] Int. Cl.² ........................................... H01L 31/04
[52] U.S. Cl. ........................... 136/89 PC; 136/89 CC
[58] Field of Search .................... 136/89 PC, 89 CC; 350/293; 126/270, 271

[56] References Cited
U.S. PATENT DOCUMENTS

| | | | |
|---|---|---|---|
| 3,130,084 | 4/1964 | Loring | 136/4 |
| 3,713,727 | 1/1973 | Markosian et al. | 350/292 |

*Primary Examiner*—Aaron Weisstuch
*Attorney, Agent, or Firm*—Stanley Z. Cole; Peter J. Sgarbossa

[57] ABSTRACT

A lens or mirror is employed to concentrate sunlight onto a photovoltaic cell. The cell employs a broad conductor around the periphery of its active surface, and narrow higher resistance conductor strips over the inner part of the surface. The cell and mirror are sized, positioned and shaped such that the image of the sun on the cell's surface is non-uniform, with a proportionately higher concentration of light falling near the periphery of the cell adjacent the peripheral conductors. Thus, the generated current is greater at the periphery, so that less energy is lost due to series resistance of the surface conductors, for more efficiency compared to a uniformly illuminated cell. The non-uniformity can conveniently be obtained by utilizing the natural spherical aberrations of a simple spherical mirror or lens. Also the cell can be positioned relatively close to the mirror outside the focal plane, so that the illuminated area on the cell is larger than the focused image of the sun in the focal plane. Thus, for given diameters of cell and mirror, the arrangement is more compact, and much less sensitive to inaccuracies in mirror curvature.

24 Claims, 4 Drawing Figures

FIG. 1
PV CELL TOPOGRAPHY

FIG. 2
CONCENTRATOR
CELL GEOMETRY

ALTERNATE:
FRESNEL OR DOUBLE CONVEX
LENS (PV CELL BELOW LENS)

FIG. 3
RADIAL ILLUMINATION PATTERNS IN PV CELL PLANE OF DIFFERENT CONCENTRATORS

CONCENTRATOR ARRANGEMENT FOR PHOTOVOLTAIC CELL

This is a continuation-in-part of application Ser. No. 666,273 filed Mar. 12, 1976, now abandoned.

FIELD OF INVENTION AND DESCRIPTION OF PRIOR ART

Because of present-day energy shortages, increasing attention is turning to the development of alternative energy sources since fossil fuel reserves are diminishing and create pollution upon combustion. One of the most promising sources appears to be solar energy, either for use as a direct heater or as a source for driving photovoltaic cells.

Photovoltaic cells are undergoing current dramatic improvements in efficiency and cost and appear to be a promising alternative energy source. However, the capital investment required for such cells is still relatively great and it appears that they always will be substantially more expensive, per unit area of illuminated surface, than direct heat exchanging solar energy receptor surfaces.

Thus the need for optical concentrators, for directing solar energy received over a relatively large area of the terrestrial surface onto a relatively small photovoltaic cell area, is apparent. Photovoltaic cells made of elements from columns III and V of the periodic table, such as aluminum, gallium, indium, phosphorus, arsenic, and antimony, can be especially useful in conjunction with concentrators since they are able to handle higher electrical currents and operate at higher temperatures than their silicon counterparts.

To optimize the conversion of solar energy to electrical energy, it is of course highly desirable to optimize the efficiency of conversion of the concentrator-photovoltaic (PV) cell arrangement.

Concentrators take the form of either (a) mirrors directed toward the sun with the PV cell positioned between the mirror and the sun, or (b) convex lenses or their equivalent Fresnel lens arrangements, in which case the lens is positioned between the PV cell and the sun.

The PV cell itself usually comprises a body of semiconductive material having metallic contacts thereto on its upper and lower surfaces for supplying the electrical energy generated in the cell. While the contact on the lower surface, i.e., the surface facing away from the source of concentrated light, presents no problem, the contact on the upper surface, that is the surface facing the source of concentrated light, presents a problem because the conductors of such contact overlie part of the active surface area of the cell and thereby block part of the concentrated light from reaching the cell.

The design of such surface conductors therefore has been carefully considered in order to optimize the tradeoff involving minimization of blockage of solar energy, while still providing a relatively low electrical resistance output for the generated electrical energy. Such surface contacts typically take the form of a mesh or comb of fine (and hence high resistance) conductors over most of the cell's area, together with a relatively broad (and hence low resistance) bus conductor, preferably away from the cell's active area, e.g., around the periphery of the cell, from which the electrical output is taken.

Heretofore optical concentrators and PV cell arrangements have been designed to illuminate the cell with maximum uniformity over its surface, or without regard to illumination uniformity. As a result of either type of illumination, the electrical energy generated in the cell is picked up by the fine conductors over the body of the cell and transmitted to the bus conductor around the periphery of the cell. However, as stated, due to their fineness, the inner conductors have an appreciable resistance, so that a not insignificant voltage drop occurs between the center of the cell and its periphery. In consequence, some areas of the cell must operate at voltages which are greater or less than optimum for generation of power, with the result that the total power generated is less than the maximum possible. In addition, a small fraction of the power is lost in resistive heating of the current-collecting mesh, still further reducing the output power. An even greater energy loss may occur if the cell is non-uniformly illuminated such that the light concentration is greater in the center of the cell since higher currents are thereby generated at the center of the cell and these must travel a relatively great distance over the fine conductors all the way to the peripheral bus, creating a greater voltage drop over the cell.

Accordingly, it is one object of the present invention to reduce the inefficiency of a PV cell-concentrator arrangement due to voltage non-uniformity and series resistance power loss. Other objects are to provide an improved concentrator PV cell arrangement, to take advantage of an inherent characteristic of an optical concentrator which was previously regarded as a drawback, to optimize the efficiency of concentrator cell arrangements, and to provide an arrangement in which the accuracy of curvature of the mirror can be relaxed. Further objects and advantages will be apparent from a consideration of the ensuing description thereof.

Figure 1:
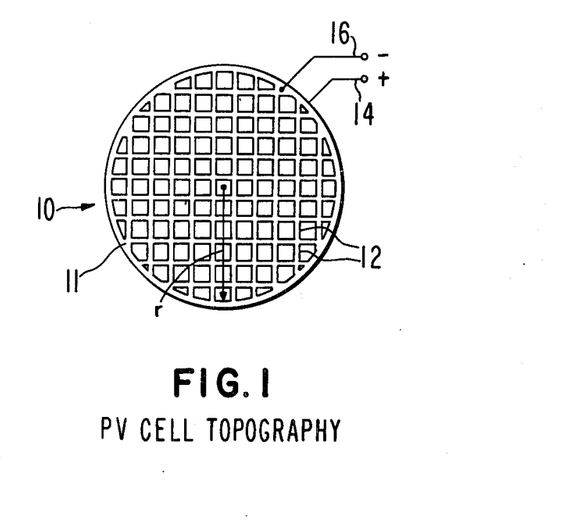
FIG. 1 is a plan view of the topography of the surface of a typical PV cell.

FIG. 1 — INVENTIVE INCREASE IN CELL EFFICIENCY BY NON-UNIFORM ILLUMINATION

The topography of a typical PV cell 10 is indicated in FIG. 1 and comprises an outer, relatively wide and low resistance bus contact 11, and inner, relatively high resistance fine contacts 12 which form a mesh over the active area or inner part of the cell. On the underside of the cell (not shown) a broad, uniform-area contact is usually provided and an output lead 14 is attached thereto. Another output lead 16 is attached to bus contact 11.

The PV cell of FIG. 1 is preferably fabricated of compounds of the III–V elements above mentioned and may be up to two to three centimeters in diameter and about 100 to 150 microns thick. Its radius is indicated by the letter "r" and will be discussed later.

In operation, when solar energy falls directly on the top surface of cell 10, an opto-electrical conversion in accordance with well known principles occurs, as a result of which a potential difference will appear across output leads 14–16 and electrical current may be drawn therefrom. The amount of energy generated is roughly proportional to the amount of illumination falling on the cell's surface.

If a given amount of optical energy E is made to fall uniformly on the surface of the cell, a uniform energy conversion will take place throughout the cell and uniform currents will be supplied to each and every portion of fine, mesh conductors 12. Those currents supplied to the mesh conductors at the center of the cell will obviously have a longer path length to travel than those supplied to the mesh conductors near bus 11, so that more energy of the current generated at the center of the cell will be lost in resistance heating of conductors 12 than is lost due to currents generated at the portion of the cell near bus 11. Also the currents will cause voltage drops or differentials across mesh conductors 12 which will in turn create variations in the voltage across different parts of the cell. Some areas will then have voltages which are not optimum for the generation of power, thereby further reducing efficiency.

In accordance with the present invention, if energy E is made to fall upon the cell in a non-uniform pattern, with a greater proportion of energy falling near bus conductor 11 at the periphery of the cell than near the center of the cell, it will be obvious that less energy will be lost in heating of conductors 12 because smaller currents will be generated at the center of the cell. In addition, the effective series resistance of the cell will be reduced, and the voltage non-uniformity due to flow of the output current will also be reduced. The larger currents generated by the greater illumination intensity at the periphery of the cell near bus 11 will travel shorter distances and thus will not encounter as high a resistance. Thereby the amount of energy generated by the cell for the same amount of input energy E will be increased.

In accordance with another aspect of the invention, I have taken advantage of the aberration characteristic of spherical optical concentrators in order to create the desired nonuniform illumination of cell 10.

In accordance with still another aspect, a mirror of a relaxed accuracy of curvature can be used.

Figure 2:
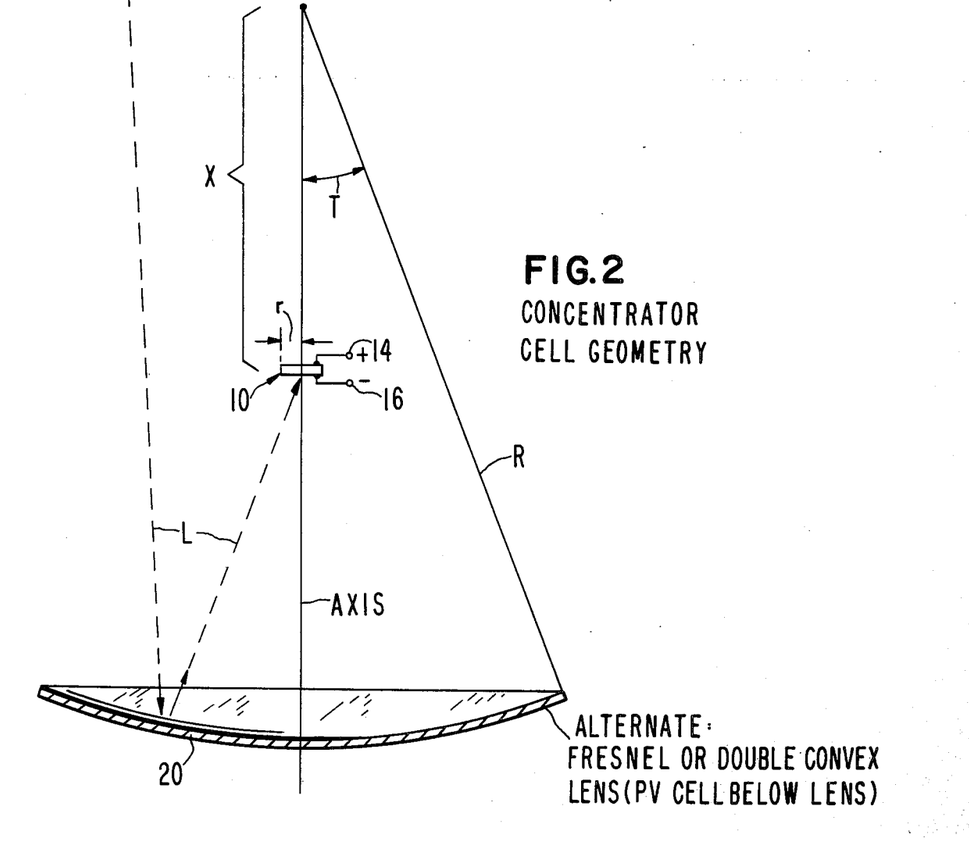
FIG. 2 is a diagram of the geometry of a concentrator-cell arrangement.

FIG. 2 — CONCENTRATOR — CELL GEOMETRY

The geometry of a typical mirror concentrator cell arrangement is indicated in FIG. 2. While a concave mirror concentrator 20 is shown, it will be apparent that the invention is also applicable to Fresnel or double-convex lens concentrators, which would be placed between the light source and the cell, as indicated by the printed notation in FIG. 2.

Light L from the sun or other optical energy source 18 is allowed to shine upon the reflecting surface of mirror 20. The axis of mirror 20 should be aligned with or pointed directly at source 18, but source 18 is shown off-axis to facilitate illustration. It is reflected from mirror 20 and directed to the surface of PV cell 10, which is mounted on the axis of mirror 20 at a point between mirror 20 and its center of curvature. Mirror 20 is most economically made a section of a sphere having a radius R. The angle T subtended by the mirror axis and any radius extending from the center of curvature point on the axis to the edge of mirror 20 is termed the angular half aperture of the mirror.

Figure 3:
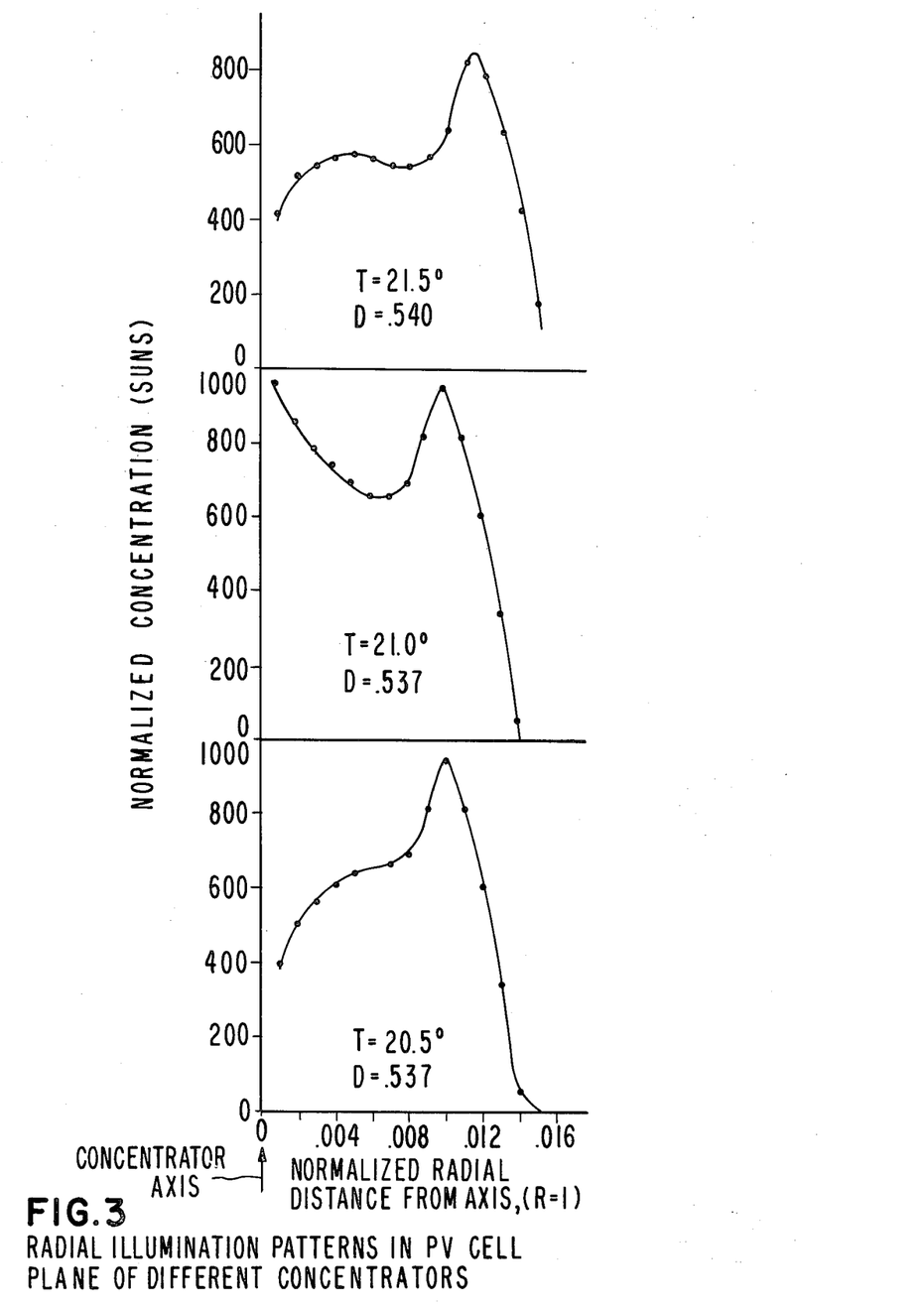
FIG. 3 shows radial illumination patterns in the PV cell planes of different concentrators.

FIG. 3 — RADIAL ILLUMINATION PATTERNS FOR INCREASE IN CONVERSION EFFICIENCY

The radial illumination on a plane coincident with the upper surface of cell 10 as a result of reflection of light from source 18 off mirror 20 is plotted in FIG. 3 for mirrors having various angular half apertures T and cell spacings D. The parameter D is the ratio of X, the distance from the center of curvature of the mirror to the cell, to R, the radius of curvature of the mirror. The radial illumination patterns for two favorable values of D (0.540 and 0.537) are illustrated in FIG. 3.

According to one aspect of the invention, advantage is taken of the fact that the illumination in the plane of the cell's surface as a result of reflection from a mirror is non-uniform due to spherical aberration. As will be shown below, it has been found that the spherical aberration characteristic for certain angular half apertures T causes the illumination to generally increase from the center of the cell, represented by the zero abscissa point, to near the edge of the cell, whereafter it drops off sharply. This non-uniform illumination, for reasons aforedescribed, decreases resistance heating losses and concomitant voltage drops in mesh conductors 12 on the cell's surface and thereby increases the opto-electrical conversion efficiency.

In the chart of FIG. 3, the ordinate numbers indicate a normalized concentration of solar energy, or suns, representing the actual light intensity divided by the intensity which would shine on the cell if it were inverted and no concentrator were employed. It can be seen that the ordinates are plotted from 0 to 1,000 suns. On the abscissa is plotted the normalized radial distance from the mirror's axis, where R, the mirror's radius, is taken as one. It can be seen that the concentration out to a distance of 0.016 R is depicted. The plots of FIG. 3 were obtained mathematically using a suitable computer program and assuming that the illumination source has uniform brightness, e.g., if source 18 represents the sun, the brightness at every point on the sun is assumed identical. (While the actual brightness of the sun is somewhat non-uniform, this does not effect the results significantly).

The top graph of FIG. 3 represents the radial illumination produced in the solar cell's plane at D = 0.540 by a mirror 20 having an angular half aperture of 21.5°. It can be seen that near the zero abscissa point, the center of the cell, the concentration is about 400 suns. Moving radially outward along any radius of the cell, it can be seen that the intensity increases first sharply, then more gradually until a radial point about 0.005 R is reached. Then the concentration drops off slightly and thereafter increases rapidly and peaks at about 0.011 R, whereafter it decreases sharply, to zero at 0.016 R.

Thus according to this aspect of the invention, the size of the photocell and the size of the mirror should be purposely selected such that the cell is nonuniformly illuminated, with the greatest illumination concentration falling near the low resistance bus contact and a lesser illumination concentration falling on other areas of the cell.

In order to capture all of the concentrated light and allow for tolerancing, the radius of the cell should be slightly greater than the radius of zero illumination. E.g., in an arrangement having the illumination pattern shown at the top of FIG. 3, the cell's radius, r, should be about 0.0165 R for maximum efficiency. This can be effected by selecting the size of the mirror, given a fixed cell radius, or by selecting the size of the cell, given a fixed mirror radius.

In the middle graph of FIG. 3, wherein T is 21°, and D = 0.537, it can be seen that the illumination is relatively great near the axis, drops off fairly sharply to reach a minimum at about 0.007 R, and then increases sharply to peak at about 0.010 R, whereafter it drops off sharply. Since the highest illumination concentration is at the center of the cell, this arrangement would not be well suited for the practice of the invention when the bus conductor is at the periphery.

However, a mirror having a T of 20.5°, with the cell placed at D = 0.537, as indicated by the bottom graph of FIG. 3, would be good for the practice of the invention since its illumination characteristic is small near the axis, increases toward a peak at about 0.010 R, and thereafter tapers down sharply to zero at about 0.015 R. Thus, in this example $r$ should be made about 0.0155 R. Near the axis, representing the center of the cell, the normalized light concentration is about 400 suns. Moving radially outward toward the peak of the graph at about 0.010 R, the illumination concentration approaches 1,000 suns, thereafter tapering to zero at the outside edge of the cell, beyond 0.015 R. Thus, at regions near the outer peripheral bus contact 11, the illumination concentration is easily made much higher than that existing at regions near the center of the cell. An expected increase of at least 25% relative to the average intensity over the active surface would be conservative.

The three plots of FIG. 3 are given to illustrate that not all mirror sizes produce spherical aberration appropriate for the invention and that an appropriate abberation must be purposely selected in order to obtain an increase in efficiency. Obviously many mirror apertures other than the 20.5° and 21.5° sizes illustrated would produce a suitable non-uniform pattern for practice of the invention. The method employed by the inventor for determining suitable dimensions was to select a trial design and with the aforementioned computer program calculate the resulting illumination pattern by integrating for various radii on the cell surface the light received from all parts of the sun's disc. The listing of the computer program is given as Program 1. The approximations used are quite accurate: the sun's disc is taken as a circle with subtended half-angle of 0.0046 radians, its distance is infinity, and its brightness is uniform. The optical relationship used for a mirror is only that the angles of incidence and reflection are equal (and, of course, that geometric optics apply). In calculating for a lens one would substitute the refraction relation, that the ratio of the sines of the angles of incidence and refraction is the reciprocal of the ratio of the indices of refraction in the respective media. With the above guidelines, one skilled in the art can readily calculate suitable geometries to carry out the invention. Since it is a trial and error process, one of course cannot derive a formula for finding the optimum dimensions or determine that the best ones have been found. Another method of design is straightforward optical measurements. A spherical mirror can be made and the distribution of concentrated light from the sun measured for various cell positions and exposed mirror apertures.

Figure 4:
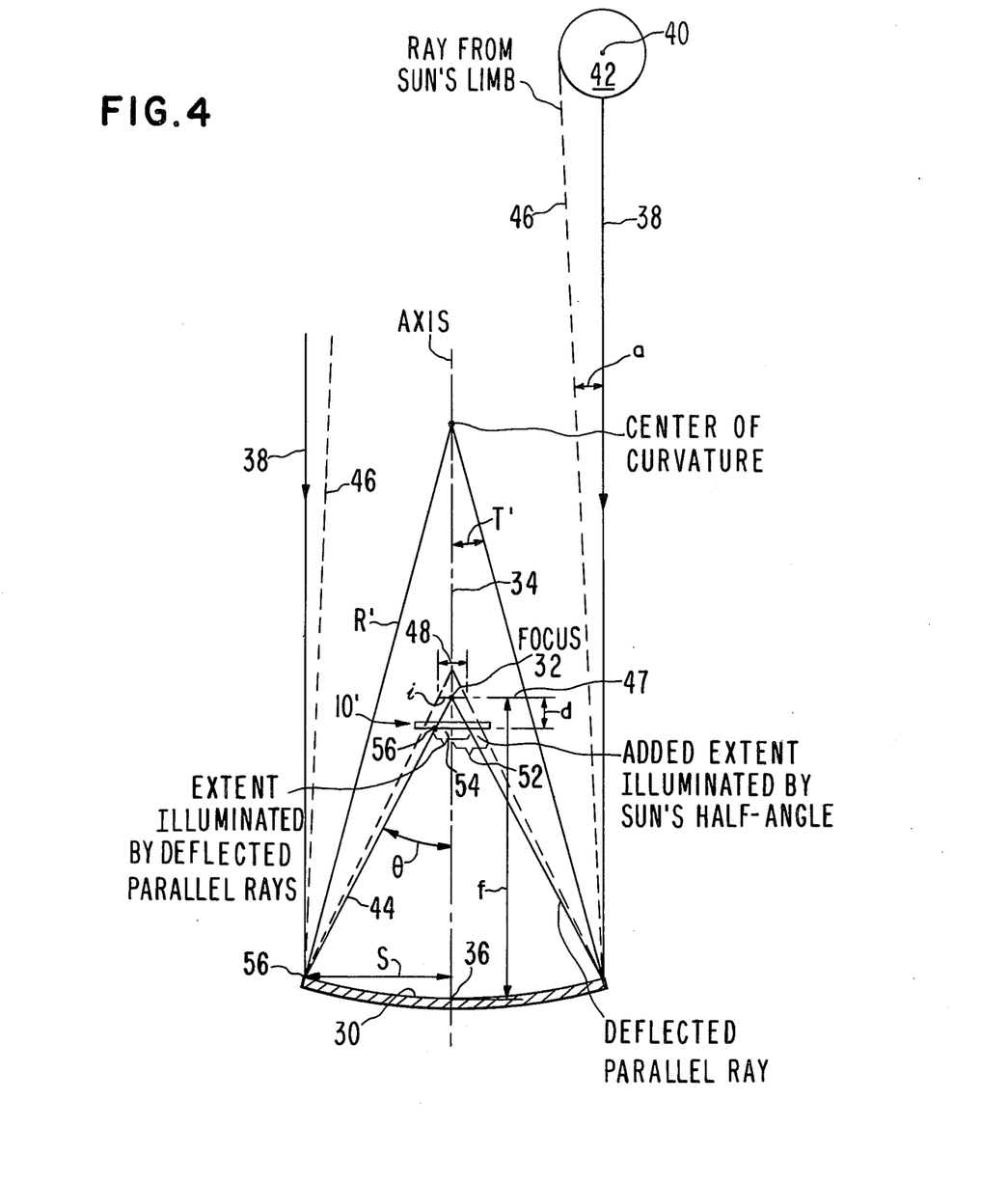
FIG. 4 is a diagram of a concentrator-cell arrangement with an improved compact arrangement and less sensitivity to mirror curvature deviations.

Another aspect of the invention is illustrated by FIG. 4. Spherical mirror 30 has its principal focus 32 on its axis 34 at a distance $f$ from its center 36 which is one-half its radius of curvature R′. Axis 34 is pointed at the center 40 of the sun 42 (shown here as displaced from axis 34 but when actually at infinity there is no difference). In the absence of photocell 10′, rays 38 from the center 40 would arrive parallel and be reflected as converging rays 44 meeting at focal point 32. In this illustration we are for clarity ignoring spherical aberration. Rays from the remainder of the sun's disc 42 out to its limb 46 would be focused in the focal plane 47 of mirror 30 to form a circular image 48 of sun 42. The radius $i$ of image 48 is given by the optical relation $i = a.f = 0.0046 f$ whre $a$ is the sun's half angle, 0.0046 radians, and $f$ is the concentrator's focal length. Or, conservatively expressed, the radius of the sun's image in the focal plane of any concentrator is about ½% of $f$, or $0.005 f$. Similarly, the approximate area of the sun's image is $(0.005 f)^2$. Thus, the active area of photocell in the focal of the concentrator when utilizing all the concentrated light is at least $(0.005 f)^2$, and the cell extends radially from its central axis for a distance of at least $0.005 f$.

According to the invention, photocell 10′ is not placed in the focal plane 47 but is substantially removed from it by a distance $d$. Radius 52 of the illuminated area is then larger than radius $i$ of image 48, by an amount which is approximately equal to the radial distance 54 from axis 34 to the point of intersection 56 of the surface of cell 10′ with the outermost ray 44 reflected from incident rays parallel to axis 34. In the absence of aberrations outermost ray 44 will come from the edge 45 of concentrator 30.

To utilize all the concentrated radiation and all the active area of the cell, the illuminated radius 52 should be equal to (or slightly smaller than) the given radius $r$ of active aperture of cell 10′. Thus, the proper focal length $f$ can be determined from the selected cell radius $r$ and the desired degree of defocusing. To secure full benefits of the invention, the illuminated radius 52 (approximately equal to $r$) should be at least twice the radius $i$ of the focused image 48. That is, $r > 2af$ or $f < 100r$. This of course indicates that $r$, the distance by which cell 10 extends radially from axis 34, must be at least 1% of $f$, since $r > 2af$, or $r > 0.0093f$; (approximately 1% of $f$). The displacement $d$ of cell 10′ from focal plane 47 can then be calculated approximately from the requirement that the radiation cover the radius $r$ of the cell. In practical cases with high concentration ratios the cell 10′ will be comparatively near focus 32 and the incident rays 44 will make a relatively small angle $\theta$ with axis 34. Then one can write a simple approximate expression for the illuminated radius $r$ from which the displacement $d$ may be estimated:

$$r = af + d \tan \theta$$

or $$d = (r - 0.0046f) \operatorname{ctn} \theta$$

For a perfect reflector, i.e., a paraboloid, the outer ray 44 will be from the outer edge of reflector 30. For concentrators with aberrations, such as spherical mirror, the exact value of $d$ may have to be found experimentally.

The focal length of the mirror is considerably shorter than would be required if the cell were in the focal plane and the focused image covered its surface. Therefore, the accuracy of curvature of mirror 20 can be relaxed to obtain a given image size tolerance vis-a-vis the accuracy of curvature which would be required if the cell were positioned at the focal plane with the corresponding required greater focal length. This is because when an image is closer to the mirror, deviations of the mirror's curvature will change the size of the concentrated image less than if the image is farther from the mirror.

This can be understood most easily by considering a numerical example. Assume that a concentration ratio of 500 is desired for a cell 2.54 cm. in diameter.

For a cell placed in the focal plane of the mirror, the mirror's area must be 0.3167 sq. m., corresponding to a chordal diameter of 63.5 cm., allowing for a reflectivity of 80%. The focal length must be 2.92 m. If a 5% (1.3 mm) tolerance on spot size is to be obtained (this is the practical maximum for good efficiency) the mirror's surface must not contain any angular deviations greater than 0.012°.

However for a cell placed, according to the invention, at a defocused point between the mirror and its center of curvature (D = 0.54), if an angular half aperture T of about 21° is used, the mirror's spherical radius would be 88.65 cm and the cell would be placed about 47.8 cm from the center of curvature or 40.9 cm from the mirror. To achieve the 5% (1.3 mm) tolerance in spot size, the mirror's surface can contain angular deviations as great as 0.09°, a relaxation of 650%. Thus an important reduction in mirror cost can be achieved.

While the invention has been described with respect to spherical mirrors of circular outline, it will be obvious that it can also be practiced with other mirror shapes, such as square or hexagonal; such shapes may often be used to advantage since they can be stacked densely and thus be useful where an array of concentrator-cell pairs is employed.

For the practice of the invention, the spherical aberration (or illumination characteristic of the mirror, if spherical aberration is not employed) should be such that the illumination is greatest at a point close to the low resistance edge contacts on the surface of the cell.

In addition to mirrors, it will be obvious that alternate concentrator arrangements such as Fresnel or double convex lenses may be employed. The spherical aberration or illumination characteristics of such concentrators should be selected in accordance with the principles aforedescribed.

While the cell has been shown as one having relatively high resistance contacts 12 in its inner portion and a belt type low resistance bus contact around its periphery, it will be apparent that the invention can be practiced with other surface metallization patterns. For example, the surface metallization could be of lowest resistance at the center of the cell (an axial takeoff contact could be employed) so that the illumination concentration would be greatest near the center of the cell and least near the periphery thereof. Also, a combination of center and and peripheral buses could be used, in which case the double peaked illumination characteristic of the middle graph of FIG. 3 would be most suitable.

Although it is preferred, according to one aspect of the invention, to place the cell between the mirror and its focal plane to achieve the maximum shortening of the distance from mirror to cell, thereby to obtain a maximum relaxation of mirror tolerances, the cell can also be placed beyond the focal plane if the illumination characteristic in such plane is suitable.

Therefore the true scope of the invention should not be determined by the examples given, but only by the scope of the appended claims and their legal equivalents.

PROGRAM 1

```
PAGE     1    SOLAR       4/12/75

1    C          PROGRAM SOLAR COMPUTES THE INTENSITY OF A SOLAR CELL.
 2    C          FOR A CIRCULAR MIRROR (TYPE=1.0)
 3    C          OR A SQUARE MIRROR WITH RHO ON VERTICAL (TYPE=2.0)
 4    C          OR A SQUARE MIRROR WITH RHO ON DIAGONAL (TYPE=3.0)
 5    C          IF TYPE=4.0 CALCULATIONS ARE DONE FOR BOTH TYPES 2.0 AND 3.0
 6    C
 7               EXTERNAL FUNC
 8               COMMON / FCOM / O,ALPHA,D,CAPR,RHO
 9               COMMON /PCOM/ PI,PIO2,PRNT,ITYPE,SINT2
10               COMMON /TCOM/ THETA2,THETA4
11               DIMENSION ARHO(1000),ARNT(1000)
12               CAPR = 1.0
13               PI = 3.1415926
14               PIO2 = PI/2.0
15         5     READ(4,10) TYPE,PRNT,PLOT
16        10     FORMAT(4F10.4)
17               READ(4,10) O,D,ALPHA
18               READ(4,10) RHOMIN,RHOMAX,DELRHO
19               READ(4,10) THMIN,THETA2,THSTEP,THCONS
20               ITYPE = TYPE
21        14     WRITE(5,15)
22        15     FORMAT(1H1,5X,25HINTENSITY OF A SOLAR CELL )
23               GO TO (20,30,40,30),ITYPE
24        20     WRITE(5,25)
25        25     FORMAT(1H ,5X,22HWITH A CIRCULAR MIRROR )
26               GO TO 50
27        30     WRITE(5,35)
28        35     FORMAT(1H ,5X, 38HWITH SQUARE MIRROR - RHO ON VERTICAL    )
29               GO TO 50
```

```
30      40 WRITE(5,45)
31      45 FORMAT(1H ,5X,38HWITH SQUARE MIRROR - RHO ON DIAGONAL    )
32         WRITE(5,55) PRNT,PLOT,O,D,ALPHA
33      55 FORMAT(1H0,5X,5HPRNT=F4.1,5X,5HPLOT=F4.1 /
34     1         1H0,5X,2HO=,F7.3,5X,2HD=,F7.3,5X,6HALPHA=,1PE13.4)
35         WRITE(5,56) RHOMIN,RHOMAX,DELRHO
36      56 FORMAT(1H0,5X,7HRHOMIN=,1PE11.4,
37     1         5X,7HRHOMAX=,1PE11.4,
38     2         5X,7HDELRHO=,1PE11.4)
39         WRITE(5,57) THMIN,THETA2,THSTEP
40      57 FORMAT(1H0,5X,6HTHMIN= F7.3,
41     1         5X,7HTHETA2=,F7.3,
42     2         5X,7HTHSTEP=,F7.3)
43      70 IF (TYPE .NE. 1.0) GO TO 72
44         THMAX = THETA2
45         GO TO 80
46      72 SINT2 = SIN(THETA2*PI/180.0)
47         THRAD = ARSIN( THCONS *SINT2)
48         THETA4 = THRAD*180.0/PI
49         THMAX = THETA4
50         WRITE(5,75) THMAX,THCONS
51      75 FORMAT(1H ,5X,6HTHMAX=,F7.3,5X,8HTHCONST=,F8.4)
52      80 NSTEP = (THMAX-THMIN)/THSTEP + 0.1
53         D = D*CAPR
54         N = (RHOMAX - RHOMIN)/DELRHO + 1.01
55         DO 100 I =1,N
56            RHO = RHOMIN + FLOAT(I-1)*DELRHO
57         IF (PRNT .EQ. 0.0) GO TO 90
58         IF (PRNT .EQ. 1.0) WRITE(5,60)
```

PAGE    2  SOLAR    4/12/75

```
59      60 FORMAT(1H0,49H     THETA      A              B              R ,
60     1        ORM   25H         R+B           R-B )
61         IF (PRNT .EQ. 2.0) WRITE(5,65)
62      65 FORMAT(1H0,49H     THETA      Y1             Y2             PH ,
63     1              25H1          PH2           I  )
64      90    CALL TRAP(FUNC,THMIN,THMAX ,NSTEP,S)
65   C     ADJUST S TO ALLOW FOR FACT THAT THMAX IS IN DEGREES
66         S = S*PI/180.0
67         WRITE(5,95) RHO,S
68      95 FORMAT(1H0,5X,5HRHO =,1PE13.4,5X,10HINTEGRAL =,1PE13.4/ )
69         IF (I .GT. 1000) GO TO 100
70         AREO(I) = RHO*10.0E+03
71         ARINT(I) = S
72     100 CONTINUE
73         IF ( PLOT .EQ. 0.0) GO TO 120
74         CALL GRAF
75     120 IF (ITYPE .NE. 4) GO TO 5
76   C     REPEAT FOR SQUARE MIRROR ON DIAGONAL
77         ITYPE = 3
78         GO TO 14
79         END
    0 ERRORS COMPILATION COMPLETE
```

PAGE    1  SOLAR    4/12/75

```
 1         SUBROUTINE TRAP (FUN,A,B,NMN,S)
 2   C
 3   C     SUBROUTINE TRAP COMPUTES AN INTEGRAL USING TRAPEZOIDAL RULE
 4   C
 5   C     FUN = FUNCTION TO BE INTEGRATED
 6   C     A   = LOWER LIMIT OF INTEGRATION
 7   C     B   = UPPER LIMIT OF INTEGRATION
 8   C     NMN = NUMBER OF STEPS USED IN INTEGRATION
 9   C     S   = VALUE OF INTEGRAL
10   C
11         N = NMN
12         FN = N
13         H = (B-A)/FN
14         S1 = 0.0
```

```
15            IF (A .NE. 0.0) S1 = 0.5*FUN(A)
16            N1 = N
17            DO 20 I =1,N1,1
18               Y1 = FUN(A + FLOAT(I)*H)
19               S1 = S1+Y1
20         20 CONTINUE
21            S = (S1-0.5*Y1)*H
22            RETURN
23            END
 0 ERRORS COMPILATION COMPLETE
```

PAGE    1  SOLAR     4/12/75

```
 1            FUNCTION FUNC(T)
 2     C      FUNCTION FUNC EVALUATES THE FUNCTION INTEGRATED IN SOLAR
 3     C
 4            COMMON / FCOM / Q,ALPHA,D,CAPR,RHO
 5            COMMON /PCOM/ PI,PIO2,PRNT,ITYPE,SINT2
 6            COMMON /QCOM/ SINT
 7            COMMON /TCOM/ THETA2,THETA4
 8            TH = T*PI/180.0
 9            TH2 = 2.0*TH
10            SINT = SIN(TH)
11            RSINT = CAPR*SINT
12            RCOST = CAPR*COS(TH)
13            SIN2T = SIN(TH2)
14            COS2T = COS(TH2)
15            TAN2T = TAN(TH2)
16            RCOS2T = CAPR * COS2T
17            D = D*CAPR
18            R = RSINT - (RCOST - D)*TAN2T
19            X = (RCOST - D)/COS2T
20            A = X*ALPHA
21            B = A/COS2T
22     C      CHECK WHETHER Y SHOULD BE COMPUTED
23            C = ABS(R) - ABS(B)
24            IF (C .GT. RHO) GO TO 68
25     C      COMPUTE TERM2A FOR Y CALCULATION
26            DEN = B*B - A*A
27            TERM1 = -A*A*R/DEN
28            TERM2A = DEN*(RHO*RHO - A*A) + A*A*R*R
29            IF (TERM2A .LT. 0.0) GO TO 67
30     C      COMPUTE Y1 ,Y2, PHI1 AND PHI2
31            TERM2 = B*SQRT(TERM2A)/DEN
32            Y1 = TERM1 + TERM2
33            Y2 = TERM1 - TERM2
34            IF (ABS(Y1) .LE. RHO) GO TO 50
35               PHI1 = 0.0
36               GO TO 60
37         50 PHI1 =ARCOS(Y1/RHO)
38            IF (PHI1 .GT. PIO2) PHI1 = PI-PHI1
39         60 IF (ABS(Y2) .LE. RHO) GO TO 65
40               PHI2 = 0.0
41            IF (PHI1 .EQ. 0.0 .AND. PHI2 .EQ. 0.0) GO TO 67
42               GO TO 70
43         65 PHI2 =ARCOS(Y2/RHO)
44            IF (PHI2 .GT. PIO2) PHI2 = PI-PHI2
45            GO TO 70
46         67 IF (C .LT. -RHO) GO TO 69
47         68 PHI1 = 0.0
48            PHI2 = 0.0
49            GO TO 70
50         69 PHI1 = PIO2
51            PHI2 = PIO2
52         70 CONTINUE
53            IF ( T .LE. THETA2) GO TO 75
54            GO TO (75,72,73,72), ITYPE
55         72 CALL VLIMIT(PHI1,T1)
56            CALL VLIMIT(PHI2,T2)
57            GO TO 80
58         73 CALL DLIMIT(PHI1,T1)
```

PAGE 2    SOLAR     4/12/75

```
59          CALL DLIMIT(PHI2,T2)
60          GO TO 80
61       75 T1 = 2.0*PHI1
62          T2 = 2.0*PHI2
63       80 CONTINUE
64          SIN4T = SIN(4.0*TH)
65          DI = Q*CAPR*CAPR*SIN4T*(T1+T2)/(4.0*PI*X*X*ALPHA*ALPHA)
66          IF ( PRNT .EQ. 0.0) GO TO 110
67          IF ( PRNT .NE. 1.0) GO TO 85
68          RPB = R+B
69          RMB = R-B
70          WRITE(5,100) T,A,B,R,RPB,RMB
71          GO TO 110
72       85 IF (PRNT .NE. 2.0) GO TO 110
73          IF (DI .EQ. 0.0) GO TO 110
74          WRITE(5,100) T,Y1,Y2,PHI1,PHI2,DI
75      100 FORMAT(1H ,F10.4,1P9E12.4)
76      110 CONTINUE
77          FUNC = DI
78          RETURN
79          END
 0 ERRORS COMPILATION COMPLETE
```

PAGE 1    SOLAR     4/12/75

```
 1          SUBROUTINE VLIMIT(Q1,T1)
 2  C       SUBROUTINE VLIMIT COMPUTES INTEGRATION LIMIT FOR PHI
 3  C       FOR SQUARE MIRROR WITH RHO ON A VERTICAL
 4  C
 5          COMMON /PCOM/ PI,PIO2,PRNT,ITYPE,SINT2
 6          COMMON /QCOM/ SINT
 7          T1 = 0.0
 8          IF (Q1 .EQ. 0.0) RETURN
 9          Q3 = ARCOS(SINT2/SINT)
10          Q4 = PIO2 - Q3
11          IF (Q1 .LE. Q3) RETURN
12          IF (Q3 .LT. Q1 .AND. Q1 .LT. Q4) T1 = Q1-Q3
13          IF (Q4 .LE. Q1) T1 = Q4-Q3
14          T1 = 2.0*T1
15          RETURN
16          END
 0 ERRORS COMPILATION COMPLETE
```

PAGE 1    SOLAR     4/12/75

```
 1          SUBROUTINE DLIMIT(Q1,T1)
 2  C       SUBROUTINE DLIMIT COMPUTES INTEGRATION LIMIT FOR PHI
 3  C       FOR SQUARE MIRROR WITH RHO ON DIAGONAL
 4  C
 5          COMMON /PCOM/ PI,PIO2,PRNT,ITYPE,SINT2
 6          COMMON /QCOM/ SINT
 7          T1 = 0.0
 8          IF (Q1 .EQ. 0.0) RETURN
 9          Q3 = ARCOS(SINT2/SINT)
10          Q13 = PI/4.0 - Q3
11          IF (Q1 .LE. Q13) T1 = Q1
12          IF (Q13 .LT. Q1 .AND. Q1 .LT. (PIO2-Q13) ) T1 = Q13
13          IF ((PIO2-Q13) .LE. Q1 .AND. Q1 .LE. PIO2)T1=Q13+Q1-PIO2+Q13
14          T1 = 2.0*T1
15          RETURN
16          END
 0 ERRORS COMPILATION COMPLETE
```

```
PAGE     1   SOLAR     4/12/75

1          FUNCTION TAN(X)
  2          TAN = SIN(X)/COS(X)
  3          RETURN
  4          END
  0 ERRORS COMPILATION COMPLETE

PAGE     1   SOLAR     4/12/75

1          FUNCTION ARCOS(X)
  2          PI = 3.14159265
  3          IF (X .EQ. 0.0) GO TO 50
  4          ACOS = ATAN ( SQRT(1.0-X*X)/X)
  5          IF (ACOS .LT. 0.0) ACOS = PI+ACOS
  6          ARCOS = ACOS
  7          RETURN
  8       50 ARCOS = PI/2.0
  9          RETURN
 10          END
  0 ERRORS COMPILATION COMPLETE

PAGE     1   SOLAR     4/12/75

1          FUNCTION ARSIN(X)
  2          PI = 3.14159265
  3          ARSIN = ATAN(X/SQRT(1.0-X*X))
  4          RETURN
  5          END
  0 ERRORS COMPILATION COMPLETE

PAGE     1   SOLAR     4/12/75

1          SUBROUTINE GRAF
  2          RETURN
  3          END
  0 ERRORS COMPILATION COMPLETE
```

What is claimed is:

1. In a solar energy conversion unit:
an optical concentrator,
a photovoltaic cell comprising; a front surface for receiving electromagnetic energy, a p-n junction, a back surface opposite said front surface, a first conductive contact on said back surface, a second contact comprising a conductor covering a minor part of said front surface, and
means for mutually positioning said concentrator and said cell;
said concentrator and said cell being shaped and mutually positioned such that, in operation, when said unit is aimed at the sun, essentially all the solar radiation emanating from said concentrator falls on said front surface, said radiation covers essentially all of said front surface, and in a region on said front surface near said conductor the radiation intensity is at least 25% greater than the average intensity over said front surface.

2. The energy conversion unit of claim 1, in which said second contact conductor includes a wider conductor and a plurality of narrower conductors spaced on said front surface and electrically connected to said wider conductor.

3. The energy conversion unit of claim 1 wherein said conductor extends around the periphery of said front surface.

4. The energy conversion unit of claim 2 wherein said front surface is flat and said concentrator comprises a ray-deflecting surface in the form of a portion of a figure of revolution about an axis perpendicular to said front surface.

5. The energy conversion unit of claim 1 wherein said front surface is flat, said concentrator is a portion of a surface of a sphere having spherical aberration, whereby said greater radiation intensity near said conductor is produced.

6. The energy conversion unit of claim 1 wherein said concentrator is a lens with a convex spherical surface.

7. A solar energy conversion unit comprising:
a concave mirror comprising a section of a sphere and having an angular half aperture of about 21.5° from its axis;
a photovoltaic cell comprising, a front surface facing said mirror for receiving concentrated light, and a conductive contact on said front surface extending about the periphery of said front surface; and
means for positioning said cell on said axis between said mirror and the center of curvature of said mirror at a distance from said center of curvature of approximately 0.540 times said radius of curvature.

8. A solar energy conversion unit comprising:
a concave mirror comprising a section of a sphere and having an angular half aperture of about 20.5° from its axis;
a photovoltaic cell comprising, a front surface facing said mirror for receiving concentrated light, and a conductive contact on said front surface extending about the periphery of said front surface; and
means for positioning said cell between said mirror and the center of curvature said mirror at a distance from said center of curvature of approximately 0.537 times said radius of curvature.

9. The energy conversion unit of claim 8 further comprising a plurality of narrower conductors spaced on said front surface and electrically connected to said conductive contact.

10. In a solar energy converter:
an optical concentrator whose light-deflecting surface comprises a portion of a surface of revolution about an axis, said concentrator having a principal focus, a photovoltaic cell having a front surface for receiving concentrated light from said concentrator, and means for mutually positioning said concentrator and said cell with said front surface intersecting said axis and facing said concentrator,
said front surface being spaced from said focus, and being greater in area than $(0.005f)^2$ where $f$ is the focal length of said concentrator,
said front surface extending transversely from said axis for a distance at least ½ percent of the focal length of said concentrator beyond the boundary of the intersection of said front surface with rays deflected by said concentrator from incident rays parallel to said axis.

11. The converter of claim 10 including a conductor covering a portion of said front surface for carrying current generated by said cell, said spacing from said focus being selected such that the concentration on said front surface of said deflected rays is greatest near said conductor.

12. The converter of claim 10 wherein said spacing from said focus is approximately $(r-0.005f)$ ctn $\theta$ where $r$ is said distance from said axis, $f$ is said focal length and $\theta$ is the angle between said axis and the outermost ray deflected by said concentrator from an incident ray parallel to said axis.

13. The converter of claim 10 wherein said distance from said axis is at least one percent of said focal length.

14. A solar energy concentrator comprising:
an optical concentrator for receiving and concentrating sunlight and having a light deflecting surface comprising a portion of a surface of revolution about an axis, said concentrator having a principal focus and exhibiting optical aberrations;
a photovoltaic cell having an active surface for receiving light from said concentrator, said active surface being of an area greater than the area of the image of the sun formed by said concentrator upon a surface at said principal focus; and
means for mutually positioning said concentrator and said cell with said active surface facing said concentrator, as well as orthogonal to and concentric with said axis, said mutual positioning being such that said active surface is nearer said concentrator than the principal focus of said concentrator, and the illuminated area of said active surface is essentially coterminous with the actual area of said active surface, and greater than the area of said image of the sun, whereby said illuminated area is rendered less sensitive to said optical aberrations, and greater compactness of the energy converter is achieved.

15. The converter of claim 14 in which said light-receiving active surface is provided with a conductor covering a portion thereof, and said optical concentrator exhibits a non-uniform illumination characteristic which concentrates greater light intensity on portions of said active surface toward said conductor.

16. The converter of claim 14 in which said means for mutually positioning adjusts the position of said cell relative to said concentrator to maximize the non-uniform concentration of light toward a conductor disposed about the periphery of said light receiving active surface.

17. The converter of claim 14 in which said light-receiving active surface is provided with a peripheral conductor, and said optical concentrator concentrates greater light intensity toward portions of said surface near the periphery thereof.

18. The converter of claim 17 in which said concentrator is a portion of a surface of a sphere, and said illumination characteristic is a result of spherical aberration.

19. In a light energy conversion unit:
a photovoltaic cell having an active surface for receiving light, said active surface having a conductive pattern affixed to a portion of said active surface for conducting away current generated by said cell,
an optical concentrator for receiving and concentrating incident light upon said active surface, said concentrator having a principal focus and a non-uniform illumination characteristic simulating said conductive pattern of said cell and causing said light to be more concentrated upon portions of said active surface not covered by said conductive pattern,
said optical concentrator and said cell being mutually positioned to place said active surface nearer said concentrator than said principal focus and to insure that all of the concentrated light falls upon said active surface, whereby said conversion unit is rendered more efficient and dimensionally more compact.

20. The unit of claim 19, in which the area of said active surface is greater than the area illuminated upon a surface positioned at the principal focus of said concentrator.

21. A unit as in claim 19, in which said optical concentrator is characterized by an illumination characteristic causing the light to be more concentrated upon portions of said active surface nearer said conductive pattern.

22. A unit as in claim 21 in which said conductive pattern includes a portion extending generally around the periphery of said active surface and said light concentrator is characterized by an illumination characteristic causing the light to be more concentrated upon portions of said active surface near said periphery.

23. A unit as in claim 19 in which said concentrator is a portion of a surface of a sphere, and said non-uniform illumination characteristic is due to spherical aberration of said concentrator.

24. A unit as in claim 23 which comprises a section of a sperical mirror.

* * * * *